(12) United States Patent
Yamada et al.

(10) Patent No.: US 10,137,534 B2
(45) Date of Patent: *Nov. 27, 2018

(54) BONDING WIRE FOR SEMICONDUCTOR DEVICE

(71) Applicants: NIPPON MICROMETAL CORPORATION, Saitama (JP); NIPPON STEEL & SUMIKIN MATERIALS CO., LTD., Tokyo (JP)

(72) Inventors: Takashi Yamada, Saitama (JP); Daizo Oda, Saitama (JP); Teruo Haibara, Saitama (JP); Ryo Oishi, Saitama (JP); Kazuyuki Saito, Saitama (JP); Tomohiro Uno, Tokyo (JP)

(73) Assignees: Nippon Micrometal Corporation, Saitama (JP); Nippon Steel & Sumikin Materials Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/107,421

(22) PCT Filed: Jul. 22, 2015

(86) PCT No.: PCT/JP2015/070861
§ 371 (c)(1),
(2) Date: Jun. 22, 2016

(87) PCT Pub. No.: WO2016/203659
PCT Pub. Date: Dec. 22, 2016

(65) Prior Publication Data
US 2017/0200689 A1  Jul. 13, 2017

(30) Foreign Application Priority Data

Jun. 15, 2015  (JP) .................... 2015-120509

(51) Int. Cl.
*B32B 15/01* (2006.01)
*B23K 35/02* (2006.01)
(Continued)

(52) U.S. Cl.
CPC ........ *B23K 35/0227* (2013.01); *B23K 35/302* (2013.01); *B23K 35/3013* (2013.01); *C22C 5/04* (2013.01); *C22C 9/00* (2013.01); *C22C 9/04* (2013.01); *C22C 9/06* (2013.01); *H01L 24/43* (2013.01); *H01L 24/45* (2013.01); *H01L 24/48* (2013.01); *B23K 2101/40* (2018.08); *H01L 24/05* (2013.01); *H01L 2224/05624* (2013.01); *H01L 2224/43* (2013.01); *H01L 2224/4312* (2013.01); *H01L 2224/4321* (2013.01); *H01L 2224/4382* (2013.01); *H01L 2224/43125* (2013.01); *H01L 2224/43848* (2013.01); *H01L 2224/43986* (2013.01); *H01L 2224/45* (2013.01); *H01L 2224/45005* (2013.01); *H01L 2224/4512* (2013.01); *H01L 2224/45015* (2013.01); *H01L 2224/45105* (2013.01); *H01L 2224/45109* (2013.01); *H01L 2224/45111* (2013.01); *H01L 2224/45113* (2013.01); *H01L 2224/45118* (2013.01); *H01L 2224/45147* (2013.01); *H01L 2224/45155* (2013.01); *H01L 2224/45169* (2013.01); *H01L 2224/45173* (2013.01); *H01L 2224/45178* (2013.01); *H01L 2224/45541* (2013.01); *H01L 2224/45565* (2013.01); *H01L 2224/45572* (2013.01); *H01L 2224/45644* (2013.01); *H01L 2224/45664* (2013.01);
(Continued)

(58) Field of Classification Search
CPC ........... H01L 24/45; H01L 2224/45574; H01L 2224/4845; H01L 2224/45147; B23K 35/0227; B23K 2201/40; B23K 35/302
USPC ....................................... 428/669
See application file for complete search history.

(56) References Cited

U.S. PATENT DOCUMENTS

| 5,637,274 A | 6/1997 | Kitamura |
| 8,389,860 B2 | 3/2013 | Uno et al. |

(Continued)

FOREIGN PATENT DOCUMENTS

| CN | 1575512 A | 2/2005 |
| CN | 101828255 A | 9/2010 |

(Continued)

OTHER PUBLICATIONS

Moon et al., Machine Translation of Description of KR 20140103767, Aug. 27, 2014 (Year: 2014).*

(Continued)

*Primary Examiner* — David Sample
*Assistant Examiner* — Mary I Omori
(74) *Attorney, Agent, or Firm* — McDermott Will & Emery LLP

(57) ABSTRACT

A bonding wire includes a Cu alloy core material, and a Pd coating layer formed on the Cu alloy core material. The bonding wire contains at least one element selected from Ni, Zn, Rh, In, Ir, and Pt. A concentration of the elements in total relative to the entire wire is 0.03% by mass or more and 2% by mass or less. When measuring crystal orientations on a cross-section of the core material in a direction perpendicular to a wire axis of the bonding wire, a crystal orientation <100> angled at 15 degrees or less to a wire axis direction has a proportion of 50% or more among crystal orientations in the wire axis direction. An average crystal grain size in the cross-section of the core material in the direction perpendicular to the wire axis of the bonding wire is 0.9 μm or more and 1.3 μm or less.

8 Claims, No Drawings

(51) Int. Cl.
*C22C 9/00* (2006.01)
*B23K 35/30* (2006.01)
*C22C 9/04* (2006.01)
*C22C 9/06* (2006.01)
*H01L 23/00* (2006.01)
*C22C 5/04* (2006.01)
*B23K 101/40* (2006.01)

(52) U.S. Cl.
CPC ........... *H01L 2224/4845* (2013.01); *H01L 2224/48227* (2013.01); *H01L 2224/48247* (2013.01); *H01L 2224/48463* (2013.01); *H01L 2224/48824* (2013.01); *H01L 2224/78* (2013.01); *H01L 2224/78251* (2013.01); *H01L 2224/85* (2013.01); *H01L 2224/85065* (2013.01); *H01L 2224/85075* (2013.01); *H01L 2224/85203* (2013.01); *H01L 2224/85444* (2013.01); *H01L 2224/85464* (2013.01); *H01L 2924/0102* (2013.01); *H01L 2924/01005* (2013.01); *H01L 2924/01012* (2013.01); *H01L 2924/01015* (2013.01); *H01L 2924/01032* (2013.01); *H01L 2924/01033* (2013.01); *H01L 2924/01034* (2013.01); *H01L 2924/01052* (2013.01); *H01L 2924/01057* (2013.01); *H01L 2924/0665* (2013.01); *H01L 2924/0705* (2013.01); *H01L 2924/10253* (2013.01); *H01L 2924/186* (2013.01)

(56) References Cited

U.S. PATENT DOCUMENTS

| | | | |
|---|---|---|---|
| 8,653,668 | B2 | 2/2014 | Uno et al. |
| 8,742,258 | B2 | 6/2014 | Terashima et al. |
| 2006/0186544 | A1* | 8/2006 | Won ............ H01L 24/45 257/741 |
| 2008/0061440 | A1 | 3/2008 | Uno et al. |
| 2009/0072399 | A1 | 3/2009 | Terashima et al. |
| 2009/0127317 | A1 | 5/2009 | Siepe et al. |
| 2009/0188696 | A1* | 7/2009 | Uno ............ B23K 20/004 174/126.2 |
| 2010/0282495 | A1* | 11/2010 | Uno ............ B21C 37/047 174/126.2 |
| 2011/0011619 | A1* | 1/2011 | Uno ............ B23K 35/0222 174/126.2 |
| 2011/0120594 | A1 | 5/2011 | Uno et al. |
| 2012/0094121 | A1 | 4/2012 | Uno et al. |
| 2012/0118610 | A1 | 5/2012 | Terashima et al. |
| 2012/0292774 | A1 | 11/2012 | Itoh |
| 2012/0299182 | A1 | 11/2012 | Uno et al. |
| 2014/0000932 | A1 | 1/2014 | Aoyama et al. |
| 2014/0209215 | A1 | 7/2014 | Chuang et al. |
| 2014/0261925 | A1* | 9/2014 | Wetzel ............ C22C 9/06 148/684 |
| 2015/0360316 | A1 | 12/2015 | Milke et al. |
| 2016/0126208 | A1 | 5/2016 | Lee et al. |
| 2017/0040281 | A1 | 2/2017 | Oyamada et al. |
| 2017/0057020 | A1 | 3/2017 | Amano et al. |
| 2017/0125135 | A1 | 5/2017 | Amano et al. |
| 2017/0194280 | A1 | 7/2017 | Oda et al. |
| 2017/0200689 | A1 | 7/2017 | Yamada et al. |
| 2017/0216974 | A1 | 8/2017 | Yamada et al. |

FOREIGN PATENT DOCUMENTS

| | | |
|---|---|---|
| CN | 102422404 A | 4/2012 |
| CN | 102459668 A | 5/2012 |
| CN | 102687259 A | 9/2012 |
| CN | 102776408 A | 11/2012 |
| CN | 103608474 A | 2/2014 |
| CN | 105518165 A | 4/2016 |
| EP | 1447842 A1 | 8/2004 |
| EP | 1 677 345 A1 | 7/2006 |
| EP | 2461358 A1 | 6/2012 |
| EP | 3 042 972 A1 | 7/2016 |
| JP | 61-48543 A | 3/1986 |
| JP | S63-238232 A | 10/1988 |
| JP | 02-170937 A | 7/1990 |
| JP | H07-86325 A | 3/1995 |
| JP | 2005-167020 A | 6/2005 |
| JP | 2006-100777 A | 4/2006 |
| JP | 2007-019349 A | 1/2007 |
| JP | 2009-140942 A | 6/2009 |
| JP | 2009-140953 A | 6/2009 |
| JP | 2011-035020 A | 2/2011 |
| JP | 2011-077254 A | 4/2011 |
| JP | 2011-159894 A | 8/2011 |
| JP | 2012-036490 A | 2/2012 |
| JP | 2012-036490 A | 2/2012 |
| JP | 2012-089685 A | 5/2012 |
| JP | 2016-517623 A | 6/2016 |
| JP | 6120693 * | 4/2017 ........ B23K 35/302 |
| KR | 10-1997-0068996 A | 11/1997 |
| KR | 10-2004-0073667 A | 8/2004 |
| KR | 10-2010-0023893 A | 3/2010 |
| KR | 10-2012-0035093 A | 4/2012 |
| KR | 10-2012-0046019 A | 5/2012 |
| KR | 10-1332890 B1 | 11/2013 |
| KR | 20140103767 A * | 8/2014 ........ B23K 35/3006 |
| KR | 10-2015-0030554 A | 3/2015 |
| TW | 201205695 A | 2/2012 |
| TW | 201448152 A | 12/2014 |
| TW | 201521128 A | 6/2015 |
| WO | 2009072525 A1 | 6/2009 |
| WO | 2009/093554 A1 | 7/2009 |
| WO | 2011/013527 A1 | 2/2011 |
| WO | 2011/093038 A1 | 8/2011 |
| WO | 2014/141975 A1 | 9/2014 |
| WO | 2015/034071 A1 | 3/2015 |
| WO | 2015/115241 A1 | 8/2015 |
| WO | 2015/163297 A1 | 10/2015 |

OTHER PUBLICATIONS

Yamane et al., Machine Translation of Abstract and Description of JPS6120693, Jan. 29, 1986 (Year: 1986).*
Extended European Search Report dated Feb. 16, 2017, issued in European Application No. 15866375.7.
Taiwanese Office Action dated Jun. 3, 2016, issued in Taiwanese Patent Application No. 10520697230.
Japanese Decision of a Patent Grant dated Jul. 19, 2016, issued in Japanese Patent Application No. 2016-533746. (w/ English translation).
International Search Report and Written Opinion dated Oct. 13, 2015 issued in International Application No. PCT/JP2015/070861.
Japan Notification of Reason(s) for Refusal dated Jan. 26, 2016 issued in Japanese Application No. 2015-552702. (w/ English translation).
Japan Decision to Grant a Patent dated Mar. 1, 2016 issued in Japanese Application No. 2015-552702. (w/ English translation).
Korean Notice of Allowance dated Aug. 30, 2016, issued in Korean Patent Application No. 10-2016-7010922.
Office Action issued in corresponding Japanese Patent Application No. 2016-151318, dated Jul. 25, 2017 with English Translation.
Notice of Allowance issued in corresponding Korean Patent Application No. 10-2017-7005522, dated Jul. 6, 2017 with English Translation.
Decision to Grant issued in corresponding Japanese Patent Application No. 2016-151318, dated Oct. 31, 2017.
Notification of Reasons for Refusal issued Taiwan Patent Application No. 104124133 dated Jun. 3, 2016.
International Search Report issued in International Application No. PCT/JP2016/064926 dated Jul. 26, 2016 (with English translation).
Notification of Reasons for Refusal issued in Japanese Application No. 2016-151318 dated Jul. 25, 2017 (with English translation).
Notice of Allowance in Korean Application No. 10-2017-7005522 dated Jul. 6, 2017 (with English translation).

(56) References Cited

OTHER PUBLICATIONS

Notification of Reasons for Refusal issued in corresponding Japanese Patent Application No. 2017-525235 dated Oct. 3, 2017.
Miyake, Yasuhiko. "Recent Aspects on Manufacturing Methods and Applications of Super Pure Copper for Industrial Use," Bulletin of the Japan Institute of Metals, vol. 31, No. 4, pp. 267-276 (1992) (with partial English translation).
Search Report issued in corresponding International Patent Application No. PCT/JP2016/067624, dated Sep. 6, 2016.
Office Action issued in Chinese Application No. 201680002657.9 dated Jan. 2, 2018 (with English translation).
Notice of Allowance in Taiwanese Application No. 105137924 dated Jan. 10, 2018.
Decision to Grant issued in related Japanese Patent Application No. 2017-525235, dated Mar. 13, 2018.
Office Action issued in corresponding Chinese Patent Application No. 201580002424.4, dated Apr. 4, 2018.
German Office Action issued in corresponding German Patent Application No. 11 2015 004 422.1, dated May 15, 2018, with English Translation.
Taiwanese Decisiion to Grant issued in corresponding Taiwanese Patent Application No. 105118619, dated Jun. 4, 2018.
German Office Action issued in corresponding German Patent Application No. 11 2016 000 133.9, dated Jun. 19, 2018, with English Translation.
S.M. Baeck et al., "Texture Analysis of Copper Bonding Wire", Materials Science Forum, vols. 408-412, (2012), pp. 803-808.
Extended European Search Report issued in corresponding European Patent Application No. 18154972.6, dated Jun. 18, 2018.
Korean Office Action issued in corresponding Korean Patent Application No. 10-2017-7024954, dated May 6, 2018, with English Translation.
Non-Final Office Action issued in related U.S. Appl. No. 15/577,735, dated Sep. 13, 2018.
Taiwanese Notice of Allowance issued in corresponding Taiwanese Patent Application No. 105140437, dated Aug. 6, 2018.

* cited by examiner

US 10,137,534 B2

BONDING WIRE FOR SEMICONDUCTOR DEVICE

CROSS-REFERENCE TO RELATED APPLICATIONS

This application is the U.S. National Phase of PCT/JP2015/070861 filed Jul. 22, 2015, which claims priority to Japanese Patent Application No. 2015-120509 filed Jun. 15, 2015. The subject matter of each is incorporated herein by reference in entirety.

TECHNICAL FIELD

The present invention relates to a bonding wire for a semiconductor device used to connect electrodes on a semiconductor device and wiring of a circuit wiring board such as outer leads.

BACKGROUND

Currently, as a bonding wire for a semiconductor device connecting between electrodes on a semiconductor device and outer leads (hereinafter may be referred to as a "bonding wire"), thin wires with a wire diameter of about 15 to 50 μm are mainly being used. A method for bonding the bonding wire is generally a thermal compressive bonding technique with the aid of ultrasound, which uses a general-purpose bonder, a capillary tool used for bonding by passing the bonding wire therethrough, and the like. A bonding process of the bonding wire includes heating and melting a wire tip with arc heat input, forming a ball (FAB: free air ball) through surface tension, performs crimp bonding (hereinafter, referred to as "ball bonding") of this ball onto the electrode of the semiconductor device heated within the range of 150 to 300° C., forming a loop, and finally performs crimp bonding (hereinafter, referred to as "wedge bonding") of a wire onto an electrode of the outer lead. As bonding counterparts of the bonding wire, an electrode structure in which an alloy mainly containing Al is formed as a film on a Si substrate is used for the electrode on the semiconductor device, whereas an electrode structure plated with Ag or Pd is used for the electrode of the outer lead.

Au, which has been mainly used as a material of the bonding wire, has been being replaced with Cu mainly for LSI use. On the background of recent proliferation of electric vehicles and hybrid vehicles, needs for replacing Au with Cu are increasing also in on-vehicle device use.

A Cu bonding wire using high-purity Cu (purity: 99.99% by mass or more) is proposed (Patent Literature 1, for example). Cu has the drawback of being more susceptible to oxidation than Au and has problems in that bonding reliability, ball formability, and wedge bondability are inferior. As a method for preventing surface oxidation of the Cu bonding wire, a structure that coats a surface of a Cu core material with a metal such as Au, Ag, Pt, Pd, Ni, Co, Cr, or Ti is proposed (Patent Literature 2). A structure that coats the surface of the Cu core material with Pd and coats a surface thereof with Au, Ag, Cu, or an alloy thereof is proposed (Patent Literature 3).

RELATED ART REFERENCE

Patent Literature

Patent Literature 1: JPA S61-48543
Patent Literature 2: JPA No. 2005-167020
Patent Literature 3: JPA No. 2012-36490

SUMMARY OF INVENTION

Problem to be Solved by the Invention

On-vehicle devices require bonding reliability in a more rigorous high-temperature and high-humidity environment than general electronic devices. In particular, the bonding longevity of a ball bonded part in which the ball part of the wire is bonded to the electrode is the biggest issue.

A mold resin (an epoxy resin) as a package of a semiconductor device contains a silane coupling agent. The silane coupling agent has a function of improving adhesiveness between organic matter (resin) and inorganic matter (silicon or metal) and can improve adhesiveness with a silicon substrate and metal. Furthermore, in a case that high adhesiveness is needed, such as a case of on-vehicle semiconductors requiring bonding reliability in a more high-temperature, "a sulfur-containing silane coupling agent" is added. Sulfur contained in the mold resin is freed when being used on the condition of 175° C. or more (175° C. to 200° C., for example). When sulfur freed at a high temperature of 175° C. or more contacts with Cu, Cu violently corrodes to produce a sulfide ($Cu_2S$) or an oxide (CuO). When the corrosion of Cu is produced in the semiconductor device using the Cu bonding wire, the bonding reliability degrades especially of the ball bonded part.

As means for evaluating reliability of the ball bonded part in a high-temperature environment at 175° C. or more, a high temperature storage test (HTS) is used. For a sample to be evaluated exposed to a high-temperature environment, temporal changes in a resistance value of the bonded part are measured, or temporal changes in shear strength of the ball bonded part are measured, thereby evaluating the bonding longevity of the ball bonded part. In on-vehicle semiconductor devices, improvement in the reliability of the ball bonded part in HTS of 175° C. to 200° C. has recently been required.

In the present invention, it has been revealed that performance in HTS at 175° C. or more in the bonding reliability of the ball bonded part in a high temperature environment is improved when the bonding wire contains at least one element selected from Ni, Zn, Rh, In, Ir, and Pt, and the concentration of the elements in total relative to the entire wire is 0.03 to 2% by mass.

An strength ratio is defined by the following Equation (1):

$$\text{Strength ratio} = \text{ultimate strength}/0.2\% \text{ offset yield strength}. \quad (1)$$

In the wedge bonding, the bonding wire extremely becomes deformed. When the wire is subjected to work hardening in the deformation, the wire after bonding hardens, resulting in a decrease in the bonding strength of the wedge bonding. In order to maintain the wedge bonding strength, the strength ratio defined by Equation (1) is preferably 1.6 or less. However, when the elements are contained in the wire for the purpose of improving the bonding reliability of the ball bonded part in HTS at 175° C. to 200° C., the strength ratio increased to exceed 1.6. Consequently, the bonding strength of the wedge bonding decreased.

An object of the present invention is to provide a bonding wire for a semiconductor device including a Cu alloy core material and a Pd coating layer formed on a surface thereof, the bonding wire for a semiconductor device containing at least one element selected from Ni, Zn, Rh, In, Ir, and Pt in a total amount of 0.03 to 2% by mass in the wire and being capable of having the strength ratio defined by Equation (1) of 1.1 to 1.6.

Means for Solving Problem

That is, the summary of the present invention is as follows.
(1) A bonding wire for a semiconductor device, the bonding wire comprising: a Cu alloy core material; and a Pd coating layer formed on a surface of the Cu alloy core material, wherein the bonding wire contains at least one element selected from Ni, Zn, Rh, In, Ir, and Pt, a concentration of the elements in total relative to the entire wire is 0.03 to 2% by mass, when measuring crystal orientations on a cross-section of the core material in a direction perpendicular to a wire axis of the bonding wire, a crystal orientation <100> angled at 15 degrees or less to a wire longitudinal direction has a proportion of 50% or more among crystal orientations in the wire longitudinal direction, and an average crystal grain size in the cross-section of the core material in the direction perpendicular to the wire axis of the bonding wire is 0.9 to 1.3 µm.
(2) The bonding wire for a semiconductor device according to (1), wherein a strength ratio defined by the following Equation (1) is 1.1 to 1.6:

Strength ratio=ultimate strength/0.2% offset yield strength. (1)

(3) The bonding wire for a semiconductor device according to (1) or (2), wherein a thickness of the Pd coating layer is 0.015 to 0.150 µm.
(4) The bonding wire for a semiconductor device according to any one of (1) to (3), further comprising an alloy skin layer containing Au and Pd on the Pd coating layer.
(5) The bonding wire for a semiconductor device according to (4), wherein a thickness of the alloy skin layer containing Au and Pd is 0.0005 to 0.050 µm.
(6) The bonding wire for a semiconductor device according to any one of (1) to (5), wherein the bonding wire contains at least one element selected from Ga, Ge, As, Te, Sn, Sb, Bi, and Se, a concentration of the at least one element in total relative to the entire wire is 0.1 to 100 ppm by mass, and Sn≤10 ppm by mass; Sb≤10 ppm by mass; and Bi≤1 ppm by mass.
(7) The bonding wire for a semiconductor device according to any one of (1) to (6), wherein the bonding wire further contains at least one element selected from B, P, Mg, Ca, and La, and a concentration of each of the at least one element relative to the entire wire is 1 to 100 ppm by mass.
(8) The bonding wire for a semiconductor device according to any one of (1) to (7), wherein Cu is present on an outermost surface of the bonding wire.

Effect of the Invention

The present invention is a bonding wire for a semiconductor device including a Cu alloy core material and a Pd coating layer formed on a surface thereof. The bonding wire, by containing at least one element selected from Ni, Zn, Rh, In, Ir, and Pt in a total amount of 0.03 to 2% by mass in the wire, improves the bonding reliability of a ball bonded part in HTS at 175° C. to 200° C., and furthermore, by making an orientation proportion of a crystal orientation <100> angled at 15 degrees or less to a wire longitudinal direction among crystal orientations in the wire longitudinal direction 50% or more when measuring crystal orientations on a cross-section of the core material in a direction perpendicular to a wire axis of the bonding wire, and making an average crystal grain size in the cross-section of the core material in the direction perpendicular to the wire axis of the bonding wire 0.9 to 1.3 µm, can have the strength ratio defined by Equation (1) of 1.1 to 1.6.

EMBODIMENT FOR CARRYING OUT THE INVENTION

As described above, a mold resin (an epoxy resin) as a package of a semiconductor device contains a silane coupling agent. The silane coupling agent has a function of improving adhesiveness between organic matter (resin) and inorganic matter (silicon or metal) and can improve adhesiveness with a silicon substrate and metal. Furthermore, in a case that high adhesiveness is needed, such as a case of on-vehicle semiconductors requiring bonding reliability in a more high-temperature, "a sulfur-containing silane coupling agent" is added. Sulfur contained in the mold resin is freed when being used on the condition of 175° C. or more (175° C. to 200° C., for example). When sulfur freed at a high temperature of 175° C. or more contacts with Cu, Cu violently corrodes to produce a sulfide ($Cu_2S$) or an oxide (CuO). When the corrosion of Cu is produced in the semiconductor device using the Cu bonding wire, the bonding reliability degrades especially of the ball bonded part.

As described above, in on-vehicle semiconductor devices, improvement in the reliability of the ball bonded part in a high temperature storage test (HTS) at 175° C. to 200° C. has recently been required.

The present invention targets a bonding wire for a semiconductor device including a Cu alloy core material and a Pd coating layer formed on a surface of the Cu alloy core material. In the present invention, the bonding wire contains at least one element selected from Ni, Zn, Rh, In, Ir, and Pt, the concentration of the elements in total relative to the entire wire being 0.03 to 2% by mass, whereby performance in HTS at 175° C. or more can be improved concerning the bonding reliability of the ball bonded part in a high-temperature environment. The bonding wire of the present invention having the specific configuration can improve the bonding reliability of the ball bonded part in a high-temperate and high-humidity environment required in on-vehicle devices.

In view of improving the bonding reliability of the ball bonded part in a high-temperature environment (especially the performance in HTS at 175° C. or more), the concentration of the elements in total relative to the entire wire is preferably 0.030% by mass or more, more preferably 0.050% by mass or more, and further preferably 0.070% by mass or more, 0.090% by mass or more, 0.10% by mass or more, 0.15% by mass or more, or 0.20% by mass or more.

As described above, an strength ratio is defined by the following Equation (1):

Strength ratio=ultimate strength/0.2% offset yield strength. (1)

In the wedge bonding, the bonding wire is extremely deformed. When the wire is subjected to work hardening in the deformation, the wire after bonding hardens, resulting in a decrease in the bonding strength of the wedge bonding. In order to maintain favorable wedge bonding strength, the strength ratio defined by Equation (1) is preferably 1.6 or less. However, when one or more of Ni, Zn, Rh, In, Ir, and Pt are contained in the wire in a total amount of 0.03% by mass or more for the purpose of improving the bonding reliability of the ball bonded part in HTS at 175° C. to 200° C., the strength ratio increased to exceed 1.6. It is considered that the alloy components contained in Cu as the core material caused an increase in the strength ratio, that is, an increase in hardness. Consequently, a decrease in the bonding strength of the wedge bonding occurred. In contrast, when the strength ratio was attempted to be reduced within the scope of a conventional method of manufacture, the strength ratio was less than 1.1, resulting in inferior wedge bondability.

Given this situation, a crystal structure that can maintain the strength ratio of Equation (1) at a preferable range of 1.1 to 1.6 even with the bonding wire containing the alloy components was studied. As a result of the study, it has been found out that in maintaining the strength ratio of Equation (1) at the preferable range, it is important to control a crystal structure of the core material of the bonding wire, especially (i) an orientation proportion of a crystal orientation <100> angled at 15 degrees or less to a wire longitudinal direction among crystal orientations in the wire longitudinal direction when measuring crystal orientations on a cross-section of the core material in a direction perpendicular to a wire axis of the bonding wire (hereinafter, may also be referred to as a "<100> orientation proportion") and (ii) an average crystal grain size in the cross-section of the core material in the direction perpendicular to the wire axis of the bonding wire (hereinafter, may also be referred to as an "average crystal grain size"). Specifically, it has been revealed that when the bonding wire is manufactured by a normal method of manufacture, the <100> orientation proportion being 50% or more and the average crystal grain size being 0.9 μm or more and 1.3 μm or less cannot be achieved simultaneously, resulting in the strength ratio of less than 1.1 or more than 1.6. In contrast, it has been revealed that by devising a method of manufacture as described below, the orientation proportion of <100> containing angled at 15 degrees or less to a wire longitudinal direction among crystal orientations in the wire longitudinal direction on a cross-section of the core material in the direction perpendicular to the wire axis of the bonding wire can be 50% or more, and the average crystal grain size in the cross-section of the core material in the direction perpendicular to the wire axis of the bonding wire can be 0.9 to 1.3 μm, as a result of which the strength ratio of Equation (1) can be 1.1 to 1.6.

If the <100> orientation proportion is 50% or more, work hardening of the wire along with the deformation at the time of the wedge boding is small, whereby the strength ratio can be 1.6 or less. However, even in this case, if the average crystal grain size is less than 0.9 μm, the 0.2% offset yield strength is high (poor in ductility), whereby the strength ratio is less than 1.1, which is inferior in the wedge bondability. If the average crystal grain size is more than 1.3 μm, it is estimated that the <100> orientation proportion is less than 50%, and in addition, the 0.2% offset yield strength is low, whereby the strength ratio is more than 1.6, and the wedge bondability is inferior.

Even when the crystal structure of the wire fulfills the conditions, if the content of the elements in the wire is excessively large, the strength ratio still increases. In view of achieving the strength ratio of 1.6 or less and reducing the hardening of the bonding wire to reduce degradation of the wedge bondability, the concentration of at least one element selected from Ni, Zn, Rh, In, Ir, and Pt in total relative to the entire wire is preferably 2.0% by mass or less, 1.8% by mass or less, or 1.6% by mass or less.

In making Ni, Zn, Rh, In, Ir, and Pt contained in the bonding wire, the effect of the invention can be exhibited by employing either of a method by which these elements are contained in the Cu core material or a method by which these elements are contained by depositing them onto the Cu core material or the wire surface. An added amount of these elements is infinitesimal and allows a wide variety of methods of addition, and the effect is exhibited by any method of addition so long as the components in the designated concentration range are contained.

In the bonding wire of the present invention, the thickness of the Pd coating layer is preferably 0.015 μm or more, more preferably 0.02 μm or more, and further preferably 0.025 μm or more, 0.03 μm or more, 0.035 μm or more, 0.04 μm or more, 0.045 μm or more, or 0.05 μm or more in view of obtaining favorable FAB shape and in view of further improving the bonding reliability of the ball bonded part in the high-temperature and high-humidity environment required in on-vehicle devices. An excessively large thickness of the Pd coating layer deteriorates the FAB shape, and the thickness of the Pd coating layer is preferably 0.150 μm or less and more preferably 0.140 μm or less, 0.130 μm or less, 0.120 μm or less, 0.110 μm or less, or 0.100 μm or less.

There will be described the definition of the Cu alloy core material and the Pd coating layer of the bonding wire. A boundary between the Cu alloy core material and the Pd coating layer was determined based on a Pd concentration. With a position at which the Pd concentration was 50 at % as the boundary, a region in which the Pd concentration was 50 at % or more was determined to be the Pd coating layer, and a region in which the Pd concentration was less than 50 at % was determined to be the Cu alloy core material. This is because if the Pd concentration is 50 at % or more in the Pd coating layer, a characteristic improvement effect can be expected from the structure of the Pd coating layer. The Pd coating layer may contain a region of a Pd single layer and a region in which Pd and Cu have concentration gradients in a wire depth direction. The reason why the region having the concentration gradients is formed in the Pd coating layer is that atoms of Pd and Cu may diffuse through heat treatment or the like in a manufacturing process. In the present invention, the concentration gradient refers to the fact that the degree of a concentration change in the depth direction is 10 mol % or more per 0.1 μm. Furthermore, the Pd coating layer may contain inevitable impurities.

The bonding wire of the present invention may further include an alloy skin layer containing Au and Pd on the surface of the Pd coating layer. With this configuration, the bonding wire of the present invention can further improve the bonding reliability and can further improve the wedge bondability.

There will be described the definition of the alloy skin layer containing Au and Pd of the bonding wire. A boundary between the alloy skin layer containing Au and Pd and the Pd coating layer was determined based on a Au concentration. With a position at which the Au concentration was 10 at % as the boundary, a region in which the Au concentration was 10 at % or more was determined to be the alloy skin layer containing Au and Pd, and a region in which the Au concentration was less than 10 at % was determined to be the Pd coating layer. Even in the region in which the Pd concentration was 50 at % or more, if Au was present in 10 at % or more, the region was determined to be the alloy skin layer containing Au and Pd. These are because if the Au concentration is in the concentration range, a characteristics improvement effect can be expected from the structure of a Au skin layer. The alloy skin layer containing Au and Pd is a Au—Pd alloy and is a region containing a region in which Au and Pd have concentration gradients in the wire depth direction. The reason why the region having the concentration gradients is formed in the alloy skin layer containing Au and Pd is that atoms of Au and Pd diffuse through the heat treatment or the like in the manufacturing process. Furthermore, the alloy skin layer containing Au and Pd may contain inevitable impurities and Cu.

In the bonding wire of the present invention, the alloy skin layer containing Au and Pd reacts with the Pd coating layer to improve adhesive strength among the alloy skin layer containing Au and Pd, the Pd coating layer, and the Cu alloy core material and to prevent the Pd coating layer and the alloy skin layer containing Au and Pd from peeling at the time of the wedge bonding. With this phenomenon, the bonding wire of the present invention can further improve the wedge bondability. In view of obtaining favorable wedge bondability, the thickness of the alloy skin layer containing Au and Pd is preferably 0.0005 μm or more and more preferably 0.001 μm or more, 0.002 μm or more, or 0.003 μm or more. In view of reducing eccentricity to obtain favorable FAB shape, the thickness of the alloy skin layer containing Au and Pd is preferably 0.050 μm or less and more preferably 0.045 μm or less, 0.040 μm or less, 0.035 μm or less, or 0.030 μm or less. The alloy skin layer containing Au and Pd can be formed by a method similar to that of the Pd coating layer.

The bonding wire of the present invention preferably further contains at least one element selected from Ga, Ge, As, Te, Sn, Sb, Bi, and Se in which the concentration of the elements in total relative to the entire wire is 0.1 to 100 ppm by mass, and Sn≤10 ppm by mass; Sb≤10 ppm by mass; and Bi≤1 ppm by mass. With this configuration, the bonding reliability of the ball bonded part in the high-temperature and high-humidity environment required in on-vehicle devices can further be improved. Especially in a high-temperature and high-humidity environment with a temperature of 130° C. and a relative humidity of 85%, the bonding longevity of the ball bonded part is improved and the bonding reliability is improved, which is favorable. The concentration of the elements in total relative to the entire wire is preferably 0.1 ppm by mass or more, more preferably 0.5 ppm by mass or more, further preferably 1 ppm by mass or more, and still further preferably 1.5 ppm by mass or more, 2 ppm by mass or more, 2.5 ppm by mass or more, or 3 ppm by mass or more. In view of obtaining favorable FAB shape, the concentration of the elements in total relative to the entire wire is preferably 100 ppm by mass or less and more preferably 95 ppm by mass or less, 90 ppm by mass or less, 85 ppm by mass or less, or 80 ppm by mass or less. If the Sn concentration or the Sb concentration is more than 10 ppm by mass, or if the Bi concentration is more than 1 ppm by mass, the FAB shape is faulty, and thus Sn≤10 ppm by mass; Sb≤10 ppm by mass; and Bi≤1 ppm by mass are favorable because these can improve the FAB shape.

The bonding wire of the present invention preferably further contains at least one element selected from B, P, Mg, Ca, and La in which the concentration of each of the elements relative to the entire wire is 1 to 100 ppm by mass. With this configuration, a crushed shape of the ball bonded part required in high-density mounting can be improved, that is, the circularity of the ball bonded part can be improved. The concentration of each of the elements relative to the entire wire is preferably 1 ppm by mass or more and more preferably 2 ppm by mass or more, 3 ppm by mass or more, 4 ppm by mass or more, or 5 ppm by mass or more. In view of reducing the hardening of the ball and reducing chip damage at the time of ball bonding, the concentration of each of the elements relative to the entire wire is preferably 100 ppm by mass or less and more preferably 95 ppm by mass or less, 90 ppm by mass or less, 85 ppm by mass or less, or 80 ppm by mass or less.

When the Pd-coated Cu bonding wire contains Ni, Zn, Rh, In, Ir, and Pt in a certain amount as in the present invention, if Cu is further present in an outermost surface of the bonding wire, the formation of a $Cu_9Al_4$ intermetallic compound in the bonded part tends to be further reduced. When the Pd-coated Cu bonding wire contains Ni, Zn, Rh, In, Ir, and Pt in a certain amount, if Cu is further present in the outermost surface of the bonding wire, interaction between Ni, Zn, Rh, In, Ir, and Pt and Cu contained in the bonding wire facilitates Pd concentration on a FAB surface during the formation of the FAB, whereby the Pd concentration on a ball bonded interface appears more remarkably. It can be estimated that with this phenomenon a mutual diffusion reduction effect of Cu and Al by a Pd concentrated layer is further enhanced, a formation amount of $Cu_9Al_4$, which is likely to corrode through the action of Cl, is reduced, and the bonding reliability of the ball bonded part in the high-temperature and high-humidity environment can further improve.

When Cu is present in the outermost surface of the Pd coating layer, if the concentration of Cu is 30 at % or more, the sulfur resistance of the wire surface degrades, and the service life of the bonding wire degrades, which is not necessarily suitable for practical use. Consequently, when Cu is present in the outermost surface of the Pd coating layer, the concentration of Cu is preferably less than 30 at %.

When Cu is present in the outermost surface of the Au skin layer, if the concentration of Cu is 35 at % or more, the sulfur resistance of the wire surface degrades, and the service life of the bonding wire degrades, which is not necessarily suitable for practical use. Consequently, when Cu is present in the outermost surface of the Au skin layer, the concentration of Cu is preferably less than 35 at %.

The outermost surface refers to a region in which the surface of the bonding wire has been measured by an Auger electron spectroscopic apparatus without performing sputtering or the like.

For the concentration analysis of the Pd coating layer and the alloy skin layer containing Au and Pd, a method that performs analysis while trimming the bonding wire from its surface in the depth direction by sputtering or the like or a method that exposes a wire cross-section and performs line analysis, point analysis, or the like thereon is effective. Examples of an analyzer used for the concentration analysis include an Auger electron spectroscopic apparatus installed in a scanning electron microscope or a transmission electron microscope, an energy dispersive X-ray analyzer, and an electron probe micro analyzer. Examples of a method for exposing the wire cross-section include mechanical polishing and ion etching. Concerning microanalysis of Ni, Zn, Rh, In, Ir, and Pt in the bonding wire, a solution obtained by dissolving the bonding wire with a strong acid is analyzed using an ICP emission spectrometer or an ICP mass spectrometer, and they can be detected as the concentrations of the elements contained in the entire bonding wire.

(Method of Manufacture)

Next, there will be described a method for manufacturing the bonding wire according to the embodiment of the present invention. The bonding wire is obtained by manufacturing a Cu alloy for use in the core material, working it into a thin wire, forming the Pd coating layer and the Au layer, and performing heat treatment. After forming the Pd coating layer and the Au layer, another wire drawing and heat treatment may be performed. There will be described a method for manufacturing the Cu alloy core material, a method for forming the Pd coating layer and the alloy skin layer containing Au and Pd, and a method of heat treatment in detail.

The Cu core alloy for use in the core material is obtained by melting Cu as a raw material and additive elements together and solidifying them. An arc heating furnace, a high-frequency heating furnace, a resistance heating furnace, or the like can be used for the melting. In order to prevent gases such as $O_2$ and $H_2$ from mixing from the air, the melting is preferably performed in a vacuum atmosphere or an inert atmosphere such as Ar or $N_2$.

Examples of the method for forming the Pd coating layer and the Au layer on the surface of the Cu alloy core material include plating, evaporative deposition, and a melting process. Both electroplating and electroless plating can be used as plating. Electroplating called strike plating or flash plating is high in plating speed and is favorable in adhesiveness with a substrate. A solution for use in electroless plating is classified into a substitutional type and a reduction type; although the substitutional type plating alone is sufficient for a smaller thickness, performing the reduction type plating in stages after the substitutional type plating is effective for a larger thickness.

In evaporative deposition, physical adsorption such as sputtering, ion plating, or vacuum deposition and chemical adsorption such as plasma CVD can be used. They are all dry processes, do not need cleaning after forming the Pd coating layer and the Au layer, and do not cause concern about surface contamination and the like during cleaning.

When heat treatment is performed after forming the Pd coating layer and the Au layer, Pd in the Pd coating layer diffuses into the Au layer, and the alloy skin layer containing Au and Pd is formed. Instead of forming the alloy skin layer containing Au and Pd through the heat treatment after forming the Au layer, the alloy skin layer containing Au and Pd may be deposited from the beginning.

For the formation of the Pd coating layer and the skin alloy layer containing Au and Pd, both a method that forms them after performing wire drawing to a final wire diameter and a method that forms them on a large-diameter Cu alloy core material and performs wire drawing a plurality of times until a target wire diameter is obtained are effective. When the Pd coating layer and the skin alloy layer containing Au and Pd are formed at the final wire diameter in the former, manufacture, quality control, and the like are simple. When the Pd coating layer, the skin alloy layer containing Au and Pd, and the wire drawing are combined in the latter, there is the advantage that adhesiveness with the Cu alloy core material improves. Specific examples of the respective methods of formation include a method that forms the Pd coating layer and the skin alloy layer containing Au and Pd on the Cu alloy core material with the final core diameter while successively sweeping the wire through an electroplating solution and a method that forms the Pd coating layer and the skin alloy layer containing Au and Pd by immersing a large-diameter Cu alloy core material into an electro or electroless plating solution and then drawing the wire to achieve the final wire diameter.

After forming the Pd coating layer and the skin alloy layer containing Au and Pd, heat treatment may be performed. Performing the heat treatment causes atoms to diffuse among the skin alloy layer containing Au and Pd, the Pd coating layer, and the Cu alloy core material, improves adhesive strength, and is effective in that the skin alloy layer containing Au and Pd and the Pd coating layer during working are prevented from peeling and productivity improves. In order to prevent $O_2$ mixing from the air, the heat treatment is preferably performed in a vacuum atmosphere or an inert atmosphere such as Ar or $N_2$.

As described above, when the conditions of diffusion heat treatment and annealing heat treatment performed on the bonding wire are adjusted, Cu as the core material diffuses through the Pd coating layer and the skin alloy layer containing Au and Pd by grain boundary diffusion, intragrain diffusion, or the like, thereby causing Cu to reach the outermost surface of the bonding wire, and enabling Cu to be present in the outermost surface. As heat treatment for causing Cu to be present in the outermost surface, the heat treatment for forming the alloy skin layer containing Au and Pd as described above can be used. In performing the heat treatment for forming the alloy skin layer, when a heat treatment temperature and time are selected, Cu is enabled to be present in the outermost surface, or Cu is not enabled to be present therein. Furthermore, the Cu concentration in the outermost surface can also be adjusted to a certain range (the range of 1 to 50 at %, for example). Cu may be diffused to the outermost surface by heat treatment performed at other than the formation of the alloy skin layer.

As described above, in making Ni, Zn, Rh, In, Ir, and Pt contained in the bonding wire, the effect of the invention can be exhibited by either of the method by which these elements are contained in the Cu core material or the method by which these elements are contained by depositing them onto the Cu core material or the wire surface. The same holds true for Ga, Ge, As, Te, Sn, Sb, Bi, Se, B, P, Mg, Ca, and La.

The simplest method of adding the components is a method by which they are added to starting materials of the Cu alloy core material. For example, high-purity copper and the component element raw materials are weighed as starting raw materials and are then heated and melted in a high vacuum or in an inert atmosphere such as nitrogen and argon to produce an ingot to which the components in a target concentration range have been added to obtain the starting materials containing the component elements of the target concentrations. Consequently, in a preferable embodiment, the Cu alloy core material of the bonding wire of the present invention contains at least one element selected from Ni, Zn, Rh, In, Ir, and Pt so that the concentration of the elements in total relative to the entire wire will be 0.03 to 2% by mass. The preferable numerical range of the total concentration is as described above. In another preferable embodiment, the Cu alloy core material of the bonding wire of the present invention contains at least one element selected from Ga, Ge, As, Te, Sn, Sb, Bi, and Se so that the concentration of the elements in total relative to the entire wire will be 0.1 to 100 ppm by mass, and Sn≤10 ppm by mass; Sb≤10 ppm by mass; and Bi≤1 ppm by mass. The preferable numerical range of the concentration is as described above. In a preferable embodiment, the purity of Cu of the Cu alloy core material is 3N or less (preferably 2N or less). In a conventional Pd-coated Cu bonding wire, in view of bondability, a Cu core material with high purity (4N or more) is used, and there is a tendency to avoid the use of a Cu core material with low purity. The bonding wire of the present invention containing the specific elements has achieved the bonding reliability of the ball bonded part in the high-temperature and high-humidity environment required in on-vehicle devices especially preferably when the Cu alloy core material in which Cu is low in purity is used as described above. In another preferable embodiment, the Cu alloy core material of the bonding wire of the present invention contains at least one element selected from B, P, Mg, Ca, and La so that the concentration of each of the elements relative to the entire wire will be 1 to 100 ppm by mass. The preferable numerical range of the concentration is as described above.

The components can also be contained by depositing the components on the wire surface during a wire manufacturing process. In this case, the deposition may be incorporated into any part of the wire manufacturing process and may be repeated a plurality of times. The deposition may be incorporated into a plurality of processes. The deposition may be added to the Cu surface before Pd coating, added to the Pd surface after Pd coating, added to the Au surface after Au coating, or incorporated into the coating processes. A method of deposition can be selected from (1) application of an aqueous solution, drying, and heat treatment (2) plating (wet), and (3) evaporative deposition (dry).

When the method of application of an aqueous solution, drying, and heat treatment is employed, first, an aqueous solution of an appropriate concentration is prepared with a water-soluble compound containing the component elements. With this preparation, the components can be incorporated into the wire material. The preparation may be incorporated into any part of the wire manufacturing process and may be repeated a plurality of times. The preparation may be incorporated into a plurality of processes. The preparation may be added to the Cu surface before Pd coating, added to the Pd surface after Pd coating, added to the Au surface after Au coating, or incorporated into the coating processes.

When plating (wet) is used, plating can be either of electroplating or electroless plating. In electroplating, plating called flash plating, which is high in plating speed and favorable in adhesiveness with a substrate, can also be used in addition to normal electroplating. A solution for use in electroless plating is classified into a substitutional type and a reduction type. The substitutional type plating is generally used for a smaller thickness, whereas the reduction type is used for a larger thickness. Either of them can be used and may be selected depending on a concentration desirably to be added, and a plating solution concentration and a time may be adjusted. Both electroplating and electroless plating may be incorporated into any part of the wire manufacturing process and may be repeated a plurality of times. Both electroplating and electroless plating may be incorporated into a plurality of processes. Both electroplating and electroless plating may be added to the Cu surface before Pd coating, added to the Pd surface after Pd coating, added to the Au surface after Au coating, or incorporated into the coating processes.

Examples of evaporative deposition (dry) include sputtering, ion plating, vacuum deposition, and plasma CVD. They have the advantages that being dry eliminates pretreatment and posttreatment and gives no concern about contamination. Although evaporative deposition generally has the problem that an addition speed of a target element is slow, it is one of the appropriate methods for the object of the present invention because the component elements are relatively low in addition concentration.

The pieces of evaporative deposition may be incorporated into any part of the wire manufacturing process or may be repeated a plurality of times. The pieces of evaporative deposition may be incorporated into a plurality of processes. The pieces of evaporative deposition may be added to the Cu surface before Pd coating, added to the Pd surface after Pd coating, added to the Au surface after Au coating, or incorporated into the coating processes.

There will be described a method for manufacture by which, a crystal orientation <100> angled at 15 degrees or less to a wire longitudinal direction among crystal orientations in the wire longitudinal direction has a proportion of 50% or more when measuring crystal orientations on a cross-section of the core material in a direction perpendicular to a wire axis of the bonding wire, and an average crystal grain size in the cross-section of the core material in the direction perpendicular to the wire axis of the bonding wire is 0.9 to 1.3 µm.

The bonding wire of the present invention contains one or more of Ni, Zn, Rh, In, Ir, and Pt in a total amount of 0.03% by mass or more in the Cu alloy core material and thereby increases the material strength (hardness) of the wire. Consequently, when performing wire drawing on the bonding wire with a Cu core wire, an area reduction rate at the time of wire drawing was as low as 5 to 8%. In heat treatment after wire drawing, the hardness is still high, and heat treatment was performed at a temperature of 600° C. or more in order to perform softening to a level capable of being used as the bonding wire. Owing to the high heat treatment temperature, the <100> orientation proportion in the wire longitudinal direction was less than 50%, and at the same time, the average crystal grain size in the cross-section of the core material was more than 1.3 µm, and the strength ratio was more than 1.6. When the heat treatment temperature was decreased in an attempt to reduce the strength ratio, the average crystal grain size in the cross-section of the core material was less than 0.9 µm, the strength ratio was less than 1.1, and the wedge bondability was inferior.

In contrast, the present invention, at the time of wire drawing using a die, sets the area reduction rate to 10% or more in half or more dies among all dies and sets the heat treatment temperature at the heat treatment after wire drawing to a low temperature of 500° C. or less. Consequently, when measuring crystal orientations on a cross-section of the core material in the direction perpendicular to the wire axis of the bonding wire, the orientation proportion of the crystal orientation <100> angled at 15 degrees or less to a wire longitudinal direction among the crystal orientations in the wire longitudinal direction could be 50% or more, and the average crystal grain size in the cross-section of the core material in the direction perpendicular to the wire axis of the bonding wire could be 0.9 to 1.3 µm. Owing to synergy of using the latest wire drawing technique, as a lubricant, designing the concentration of a non-ionic surfactant contained in the lubricant at higher than a conventional one, as a die shape, designing an approach angle of the die gentler than a conventional one, setting a cooling water temperature of the die to lower than a conventional one, and the like, wire drawing with an area reduction rate of 10% or more was enabled despite the hardening caused by the Cu alloy core material containing the components such as Ni in a total amount of 0.03% by mass.

When the crystal orientations on the wire cross-section are measured, electron backscattered diffraction (EBSD) is preferably used. EBSD is characterized by observing crystal orientations on the observation surface and enabling an angle difference of the crystal orientations between adjacent measurement points to be illustrated and can observe the crystal orientations with high accuracy while being relatively simple even for a thin wire like the bonding wire. Grain size measurement can be determined by using analysis software installed in an apparatus for measurement results by EBSD. The crystal grain size prescribed in the present invention is obtained by performing an arithmetic mean on an equivalent diameter of crystal grains contained in a measurement area (the diameter of a circle equivalent to an area of a crystal grain; a circle-equivalent diameter).

The present invention is not limited to the embodiment, and appropriate alterations can be made within the scope of the essence of the present invention.

EXAMPLES

The following specifically describes the bonding wire according to an embodiment of the present invention with reference to examples.

(Sample)

First, the following describes a method for manufacturing a sample. Cu as a raw material of the core material with a purity of 99.99% by mass or more and containing inevitable impurities as the remainder was used. Au, Pd, Ni, Zn, Rh, In, Ir, and Pt with a purity of 99% by mass or more and containing inevitable impurities as the remainder were used. Ni, Zn, Rh, In, Ir, and Pt as additive elements to the core material are mixed so that the wire or the core material will have a target composition. Regarding the addition of Ni, Zn, Rh, In, Ir and Pt, they can be mixed singly.

Alternatively, they may be mixed so as to be a desired amount using a Cu master alloy containing the additive elements manufactured in advance if the element has a high melting point as a single body or if the element is added in an infinitesimal amount. Working examples listed in Table 3 further contain one or more of Ga, Ge, As, Te, Sn, Sb, Bi, Se, B, P, Mg, Ca, and La.

The Cu alloy as the core material was manufactured to give a wire diameter of a few millimeters by continuous casting. The obtained alloy of a few millimeters was drawn to manufacture a wire with a diameter of 0.3 to 1.4 mm. A commercially available lubricant was used for the wire drawing, and a wire drawing speed was 20 to 150 m/min. In order to remove an oxide film on the wire surface, pickling treatment with hydrochloric acid or the like was performed, and the Pd coating layer was formed by 1 to 15 μm so as to cover the entire surface of the Cu alloy as the core material. Furthermore, for partial wires, the alloy skin layer containing Au and Pd was formed by 0.05 to 1.5 μm on the Pd coating layer. For the formation of the Pd coating layer and the alloy skin layer containing Au and Pd, electroplating was used. A commercially available semiconductor plating solution was used for a plating solution. Thereafter, wire drawing was performed mainly using dies with an area reduction rate of 10 to 21%, and furthermore, one to three pieces of heat treatment were performed at 200 to 500° C. during the wire drawing to perform working to a diameter of 20 μm. After working, heat treatment was performed so that breaking elongation would finally be about 5 to 15%. A method of heat treatment was performed while successively sweeping the wire and was performed while causing a N₂ or Ar gas to flow. A wire feeding speed was 10 to 90 m/min, a heat treatment temperature was 350 to 500° C., and a heat treatment time was 1 to 10 seconds.

(Method of Evaluation)

The contents of Ni, Zn, Rh, In, Ir, Pt, Ga, Ge, As, Te, Sn, Sb, Bi, Se, B, P, Mg, Ca, and La in the wire were analyzed as the concentrations of the elements contained in the entire bonding wire using an ICP emission spectrometer.

For the concentration analysis of the Pd coating layer and the skin alloy layer containing Au and Pd, Auger electron spectrometry was performed while trimming the bonding wire from its surface in the depth direction by sputtering or the like. From an obtained concentration profile in the depth direction, the thickness of the Pd coating layer, the thickness of the skin alloy layer containing Au and Pd were determined.

The orientation proportion of the crystal orientation <100> angled at 15 degrees or less to the wire longitudinal direction among the crystal orientations in the wire longitudinal direction in the cross-section of the core material in the direction perpendicular to the wire axis of the bonding wire was calculated by observing crystal orientations of an observation surface (that is, the cross-section of the core material in the direction perpendicular to the wire axis) by EBSD. For the analysis of EBSD measurement data, exclusive software (OIM analysis manufactured by TSL Solutions, for example) was used. The average crystal grain size in the cross-section of the core material in the direction perpendicular to the wire axis was calculated by observing the crystal orientations on the observation surface by EBSD. For the analysis of EBSD measurement data, exclusive software (OIM analysis manufactured by TSL Solutions, for example) was used. The crystal grain size was obtained by performing an arithmetic mean on an equivalent diameter of crystal grains contained in a measurement area (the diameter of a circle equivalent to an area of a crystal grain; a circle-equivalent diameter).

The 0.2% offset yield strength and the ultimate strength were evaluated by performing a tensile test with an intermark distance of 100 mm. A universal material test machine Type 5542 manufactured by Instron was used for a tensile test apparatus. The 0.2% offset yield strength was calculated using exclusive software installed in the apparatus. A load at the time of breaking was determined to be the ultimate strength. The strength ratio was calculated from the following Equation (1)

$$\text{Strength ratio} = \text{ultimate strength}/0.2\% \text{ offset yield strength.} \quad (1)$$

The evaluation of the wedge bondability in the wire bonded part was determined by performing 1,000 pieces of bonding on wedge bonding parts of a BGA substrate and by the occurrence frequency of peeling of the bonded parts. The used BGA substrate was plated with Ni and Au. In this evaluation, assuming bonding conditions more rigorous than normal, a stage temperature was set to 150° C., which was lower than a general set temperature range. In the evaluation, a case in which 11 or more failures occurred was determined to be problematic to be marked with a symbol of "cross", a case of 6 to 10 failures was determined to be practicable but somewhat problematic to be marked with a symbol of "triangle", a case of 1 to 5 failures was determined to be no problem to be marked with a symbol of "circle", and a case in which no failure occurred was determined to be excellent to be marked with a symbol of "double circle" in the column "wedge bondability" in Table 1.

The bonding reliability of the ball bonded part in a high-temperature and high humidity environment or a high-temperature environment was determined by manufacturing a sample for bonding reliability evaluation, performing HTS evaluation, and by the bonding longevity of the ball bonded part. The sample for bonding reliability evaluation was manufactured by performing ball bonding onto an electrode formed by forming an alloy of Al-1.0% Si-0.5% Cu as a film with a thickness of 0.8 μm on a Si substrate on a general metallic frame using a commercially available wire bonder and sealing it with a commercially available epoxy resin. A ball was formed while causing a N₂+5% H₂ gas to flow at a flow rate of 0.4 to 0.6 L/min, and its size was within the range of a diameter of 33 to 34 μm.

For the HTS evaluation, the manufactured sample for bonding reliability evaluation was exposed to a high-temperature environment with a temperature of 200° C. using a high-temperature thermostatic device. A shear test on the ball bonded part was performed every 500 hours, and a time when a value of shear strength was half the shear strength initially obtained was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HTS evaluation. An average value of measurement values of 10 ball bonded parts randomly selected was used for the value of the shear strength. In the evaluation, the bonding longevity being 500 to 1,000 hours was determined to be practicable but desirably to be improved to be marked with a symbol of "triangle", being 1,000 to 3,000 hours was determined to be practically no problem to be marked with a symbol of "circle", and being 3,000 hours or more was determined to be especially excellent to be marked with a symbol of "double circle".

For the evaluation of ball formability (FAB shape), a ball before performing bonding was collected and observed, and the presence or absence of voids on the ball surface and the presence or absence of deformation of the ball, which is primarily a perfect sphere, were determined. The occurrence of any of the above was determined to be faulty. The formation of the ball was performed while a $N_2$ gas was blownsprayed at a flow rate of 0.5 L/min in order to reduce oxidation in a melting process. The size of the ball was 34 μm. For one condition, 50 balls were observed. A SEM was used for the observation. In the evaluation of the ball formability, a case in which five or more failures occurred was determined to be problematic to be marked with a symbol of "cross", a case of three or four failures was determined to be practicable but somewhat problematic to be marked with a symbol of "triangle", a case of one or two failures was determined to be no problem to be marked with a symbol of "circle", and a case in which no failure occurred was determined to be excellent to be marked with a symbol of "double circle" in the column "FAB shape" in Table 1.

The bonding longevity of the ball bonded part in the high-temperature and high-humidity environment with a temperature of 130° C. and a relative humidity of 85% can be evaluated by the following HAST evaluation. For the HAST evaluation, the manufactured sample for bonding reliability evaluation was exposed to a high-temperature and high-humidity environment with a temperature of 130° C. and a relative humidity of 85% using an unsaturated type pressure cooker tester and was biased with 5 V. A shear test on the ball bonded part was performed every 48 hours, and a time when a value of shear strength was half the shear strength initially obtained was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HAST evaluation. An average value of measurement values of 10 ball bonded parts randomly selected was used for the value of the shear strength. In the evaluation, the bonding longevity being 144 hours or more and less than 288 hours was determined to be practically no problem to be marked with a symbol of "circle", being 288 hours or more and less than 384 hours was determined to be excellent to be marked with a symbol of "double circle", and being 384 hours or more was determined to be especially excellent to be marked with a symbol of "a pair of double circles" in the column "HAST" in Table 1.

The evaluation of a crushed shape of the ball bonded part was determined by observing the ball bonded part after bonding from immediately above and by its circularity. For a bonding counterpart, an electrode in which an Al-0.5% Cu alloy was formed as a film with a thickness of 1.0 μm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the evaluation, a case in which one to three failures was determined to be no problem to be marked with a symbol of "circle", and a case in which a favorable perfect circle was obtained for all was determined to be especially excellent to be marked with a symbol of "double circle" in the column "crushed shape" in Table 1.

TABLE 1

| | | | | | | | | | | | Crystal structure | |
| --- | --- | --- | --- | --- | --- | --- | --- | --- | --- | --- | --- | --- |
| | | Wire component (% by mass) | | | | | | Film thickness of Pd coating layer | Film thickness of alloy skin layer containing Au and Pd | <100> Proportion of wire C section | Average crystal grain size |
| | No. | Ni | Zn | Rh | In | Ir | Pt | Total | (μm) | (μm) | (%) | (μm) |
| Working Example | 1 | 0.7 | | | | | | 0.7 | 0.015 | — | 92 | 1.1 |
| | 2 | | 1.2 | | | | | 1.2 | 0.050 | — | 72 | 0.9 |
| | 3 | | | 1.0 | | | | 1.0 | 0.100 | — | 71 | 1.0 |
| | 4 | | | | 0.5 | | | 0.5 | 0.150 | — | 72 | 1.1 |
| | 5 | | | | | 0.1 | | 0.1 | 0.015 | — | 75 | 1.2 |
| | 6 | | | | | | 0.03 | 0.03 | 0.050 | — | 63 | 1.3 |
| | 7 | 1.1 | | | 0.3 | | | 1.4 | 0.100 | — | 75 | 1.0 |
| | 8 | | 1.2 | | | 0.8 | | 2.0 | 0.150 | — | 65 | 0.9 |
| | 9 | | | 0.7 | | | 0.1 | 0.8 | 0.015 | — | 51 | 1.2 |
| | 10 | 0.6 | | 0.1 | 0.05 | | | 0.75 | 0.100 | — | 97 | 1.2 |
| | 11 | | 0.8 | | 0.8 | 0.3 | | 1.9 | 0.150 | — | 80 | 1.1 |
| | 12 | 0.05 | | 0.05 | | | 0.05 | 0.15 | 0.015 | — | 70 | 1.2 |
| | 13 | | 1.0 | | | 0.1 | 0.3 | 1.4 | 0.015 | — | 54 | 1.0 |
| | 14 | 0.5 | | | | | | ″ 0.5 | 0.015 | 0.0005 | 91 | 1.1 |
| | 15 | | 1.2 | | | | | ″ 1.2 | 0.050 | 0.0010 | 70 | 0.9 |
| | 16 | | | 0.7 | | | | ″ 0.7 | 0.100 | 0.0100 | 69 | 1.1 |

TABLE 1-continued

| No. | | | | | | | | |
|---|---|---|---|---|---|---|---|---|
| 17 | | 0.3 | | | ″ 0.3 | 0.150 | 0.0500 | 70 | 1.2 |
| 18 | | | 0.1 | | ″ 0.1 | 0.015 | 0.0005 | 76 | 1.2 |
| 19 | | | | 0.05 | ″ 0.05 | 0.050 | 0.0010 | 64 | 1.3 |
| 20 | 0.5 | | 0.3 | | ″ 0.8 | 0.100 | 0.0100 | 74 | 1.1 |
| 21 | | 1.2 | | 0.1 | ″ 1.3 | 0.150 | 0.0500 | 64 | 1.2 |
| 22 | | 0.7 | | 0.01 | ″ 0.71 | 0.015 | 0.0005 | 50 | 1.1 |
| 23 | 0.6 | 0.1 | 0.05 | | ″ 0.75 | 0.050 | 0.0010 | 98 | 1.0 |
| 24 | | 0.8 | 0.8 | 0.3 | ″ 1.9 | 0.100 | 0.0100 | 85 | 0.9 |
| 25 | 0.05 | | 0.05 | 0.05 | ″ 0.15 | 0.150 | 0.0500 | 74 | 1.3 |
| 26 | | 1.0 | | 0.1 0.3 | ″ 1.4 | 0.015 | 0.0100 | 51 | 0.9 |

| | | Mechanical characteristics | | | Wire quality | | | | |
|---|---|---|---|---|---|---|---|---|---|
| | No. | Maximum yield strength ① (mN/μm²) | 0.2% Yield strength ② | Yield strength ratio ①/② | Wedge bondability | HTS | FAB shape | HAST | Crushed shape |
| Working Example | 1 | 0.19 | 0.16 | 1.19 | ◎ | ◎ | ○ | ○ | ○ |
| | 2 | 0.22 | 0.17 | 1.29 | ◎ | ◎ | ◎ | ○ | ○ |
| | 3 | 0.24 | 0.16 | 1.50 | ○ | ◎ | ◎ | ○ | ○ |
| | 4 | 0.29 | 0.24 | 1.21 | ◎ | ◎ | ○ | ○ | ○ |
| | 5 | 0.30 | 0.22 | 1.36 | ◎ | ◎ | ○ | ○ | ○ |
| | 6 | 0.31 | 0.20 | 1.55 | ○ | ◎ | ◎ | ○ | ○ |
| | 7 | 0.33 | 0.28 | 1.18 | ◎ | ◎ | ◎ | ○ | ○ |
| | 8 | 0.34 | 0.27 | 1.26 | ◎ | ◎ | ○ | ○ | ○ |
| | 9 | 0.35 | 0.22 | 1.59 | ○ | ◎ | ○ | ○ | ○ |
| | 10 | 0.33 | 0.30 | 1.10 | ◎ | ◎ | ◎ | ○ | ○ |
| | 11 | 0.34 | 0.28 | 1.21 | ◎ | ◎ | ○ | ○ | ○ |
| | 12 | 0.35 | 0.22 | 1.59 | ○ | ◎ | ○ | ○ | ○ |
| | 13 | 0.35 | 0.23 | 1.52 | ◎ | ◎ | ○ | ○ | ○ |
| | 14 | 0.20 | 0.18 | 1.11 | ◎ | ◎ | ○ | ○ | ○ |
| | 15 | 0.21 | 0.17 | 1.24 | ◎ | ◎ | ◎ | ○ | ○ |
| | 16 | 0.22 | 0.15 | 1.47 | ◎ | ◎ | ◎ | ○ | ○ |
| | 17 | 0.28 | 0.24 | 1.17 | ◎ | ◎ | ○ | ○ | ○ |
| | 18 | 0.29 | 0.22 | 1.32 | ◎ | ◎ | ○ | ○ | ○ |
| | 19 | 0.30 | 0.19 | 1.58 | ◎ | ◎ | ◎ | ○ | ○ |
| | 20 | 0.33 | 0.28 | 1.18 | ◎ | ◎ | ◎ | ○ | ○ |
| | 21 | 0.34 | 0.26 | 1.31 | ◎ | ◎ | ○ | ○ | ○ |
| | 22 | 0.35 | 0.23 | 1.52 | ○ | ◎ | ○ | ○ | ○ |
| | 23 | 0.30 | 0.20 | 1.50 | ◎ | ◎ | ◎ | ○ | ○ |
| | 24 | 0.33 | 0.29 | 1.14 | ◎ | ◎ | ◎ | ○ | ○ |
| | 25 | 0.34 | 0.25 | 1.36 | ◎ | ◎ | ○ | ○ | ○ |
| | 26 | 0.35 | 0.25 | 1.40 | ◎ | ◎ | ○ | ○ | ○ |

TABLE 2

| | | Wire component (% by mass) | | | | | | | Film thickness of Pd coating layer (μm) | Film thickness of alloy skin layer containing Au and Pd (μm) | Crystal structure | |
|---|---|---|---|---|---|---|---|---|---|---|---|---|
| | | | | | | | | | | | <100> Proportion of wire C section (%) | Average crystal grain size (μm) |
| | No. | Ni | Zn | Rh | In | Ir | Pt | Total | | | | |
| Comparative Example | 1 | 0.7 | | | | | | ″ 0.7 | 0.015 | — | 50 | 0.8 |
| | 2 | | 1.2 | | | 0.8 | | ″ 2.0 | 0.150 | — | 49 | 1.5 |
| | 3 | 0.6 | | 0.1 | 0.05 | | | ″ 0.75 | 0.100 | — | 51 | 0.7 |
| | 4 | | | | | | 0.03 | ″ 0.03 | 0.050 | — | 45 | 0.9 |
| | 5 | | | 0.7 | | | 0.1 | ″ 0.8 | 0.015 | — | 40 | 1.1 |
| | 6 | | 0.8 | | 0.8 | 0.3 | | ″ 1.9 | 0.150 | — | 30 | 1.3 |
| | 7 | | 1.2 | | | | | ″ 1.2 | 0.050 | — | 41 | 1.0 |
| | 8 | 1.1 | | | 0.3 | | | ″ 1.4 | 0.100 | — | 45 | 1.4 |
| | 9 | 0.05 | | 0.05 | | 0.05 | | ″ 0.15 | 0.015 | — | 48 | 1.6 |

TABLE 2-continued

|  | No. | Mechanical characteristics | | | Wire quality | | | | |
|---|---|---|---|---|---|---|---|---|---|
|  |  | Maximum yield strength ① (mN/μm²) | 0.2% Yield strength ② (mN/μm²) | Yield strength ratio ①/② — | Wedge bondability | HTS | FAB shape | HAST | Crushed shape |
| Comparative Example | 1 | 0.20 | 0.12 | 1.09 | X | ◎ | ○ | ○ | ○ |
|  | 2 | 0.29 | 0.16 | 1.81 | X | ◎ | ○ | ○ | ○ |
|  | 3 | 0.34 | 0.19 | 1.08 | X | ◎ | ◎ | ○ | ○ |
|  | 4 | 0.21 | 0.12 | 1.75 | X | ◎ | ◎ | ○ | ○ |
|  | 5 | 0.30 | 0.17 | 1.76 | X | ◎ | ○ | ○ | ○ |
|  | 6 | 0.35 | 0.19 | 1.84 | X | ◎ | ○ | ○ | ○ |
|  | 7 | 0.21 | 0.12 | 1.75 | X | ◎ | ◎ | ○ | ○ |
|  | 8 | 0.30 | 0.18 | 1.67 | Δ | ◎ | ◎ | ○ | ○ |
|  | 9 | 0.34 | 0.20 | 1.70 | Δ | ◎ | ○ | ○ | ○ |

TABLE 3

|  | No. | Wire component (% by mass) | | | | | | | | Film thickness of Pd coating layer (μm) | Film thickness of alloy skin layer containing Au and Pd (μm) | Crystal structure | |
|---|---|---|---|---|---|---|---|---|---|---|---|---|---|
|  |  | Ni | Zn | Rh | In | Ir | Pt | Total | Others |  |  | <100> Proportion of wire C section (%) | Average crystal grain size (μm) |
| Working Example | 27 | 0.7 |  |  |  |  |  | ″0.7 | Ga: 0.007 | 0.100 |  | 88 | 0.9 |
|  | 28 |  | 1.1 |  |  |  |  | ″1.1 | Ge: 0.008 | 0.050 |  | 75 | 1.0 |
|  | 29 |  |  | 0.7 |  |  |  | ″0.7 | As: 0.003 | 0.050 |  | 72 | 1.0 |
|  | 30 |  |  |  | 1.2 |  |  | ″1.2 | Te: 0.001 | 0.150 |  | 67 | 1.2 |
|  | 31 |  |  |  |  | 0.5 |  | ″0.5 | Sn: 0.0007 | 0.015 |  | 66 | 1.0 |
|  | 32 |  |  |  |  |  | 0.05 | ″0.05 | Sb: 0.0008 | 0.050 |  | 74 | 1.1 |
|  | 33 | 1.0 |  |  |  |  |  | ″1.0 | Bi: 0.00008 | 0.100 |  | 80 | 1.1 |
|  | 34 |  | 0.8 |  |  |  |  | ″0.8 | Se: 0.0001 | 0.100 |  | 92 | 0.9 |
|  | 35 |  |  | 0.05 |  |  |  | ″0.05 | Ga: 0.003 Te: 0.0008 | 0.100 |  | 72 | 1.2 |
|  | 36 |  |  |  | 0.08 |  |  | ″0.08 | Ge: 0.003 Sb: 0.0007 | 0.150 | 0.0050 | 55 | 1.3 |
|  | 37 |  |  |  |  | 0.1 |  | ″0.1 | As: 0.001 Se: 0.001 | 0.150 | 0.0100 | 82 | 1.1 |
|  | 38 | 0.08 |  |  |  |  |  | ″0.08 | B: 0.0008 | 0.050 |  | 74 | 1.1 |
|  | 39 |  | 1.2 |  |  |  |  | ″1.2 | P: 0.004 | 0.050 |  | 77 | 1.2 |
|  | 40 |  |  | 0.05 |  |  |  | ″0.05 | Mg: 0.005 | 0.100 |  | 91 | 1.0 |
|  | 41 |  |  |  | 0.5 |  |  | ″0.5 | Ca: 0.003 | 0.015 |  | 68 | 1.0 |
|  | 42 |  |  |  |  | 0.1 |  | ″0.1 | La: 0.003 | 0.100 | 0.0100 | 91 | 0.9 |
|  | 43 |  |  |  |  |  | 0.05 | ″0.05 | P: 0.006 B: 0.0008 | 0.050 | 0.0050 | 68 | 1.1 |
|  | 45 | 0.6 |  |  |  |  |  | ″0.6 | P: 0.003 Ca: 0.001 | 0.015 | 0.0100 | 57 | 1.3 |

|  | No. | Mechanical characteristics | | | Wire quality | | | | |
|---|---|---|---|---|---|---|---|---|---|
|  |  | Maximum yield strength ① (mN/μm²) | 0.2% Yield strength ② (mN/μm²) | Yield strength ratio ①/② — | Wedge bondability | HTS | FAB shape | HAST | Crushed shape |
| Working Example | 27 | 0.22 | 0.18 | 1.22 | ◎ | ◎ | ◎ | ◎ | ○ |
|  | 28 | 0.25 | 0.17 | 1.47 | ◎ | ◎ | ◎ | ◎ | ○ |
|  | 29 | 0.30 | 0.21 | 1.43 | ◎ | ◎ | ◎ | ◎ | ○ |
|  | 30 | 0.31 | 0.24 | 1.29 | ◎ | ◎ | ○ | ◎ | ○ |
|  | 31 | 0.29 | 0.22 | 1.32 | ◎ | ◎ | ○ | ◎ | ○ |
|  | 32 | 0.35 | 0.29 | 1.21 | ◎ | ◎ | ◎ | ◎ | ○ |
|  | 33 | 0.31 | 0.22 | 1.41 | ◎ | ◎ | ◎ | ◎ | ○ |
|  | 34 | 0.27 | 0.19 | 1.42 | ◎ | ◎ | ◎ | ◎ | ○ |
|  | 35 | 0.30 | 0.19 | 1.58 | ○ | ◎ | ◎ | ◎ | ○ |
|  | 36 | 0.33 | 0.25 | 1.32 | ◎ | ◎ | ○ | ◎ | ○ |
|  | 37 | 0.32 | 0.25 | 1.28 | ◎ | ◎ | ○ | ◎ | ○ |
|  | 38 | 0.34 | 0.23 | 1.48 | ◎ | ◎ | ◎ | ○ | ◎ |
|  | 39 | 0.29 | 0.20 | 1.45 | ◎ | ◎ | ◎ | ○ | ◎ |

TABLE 3-continued

| 40 | 0.33 | 0.28 | 1.18 | ◎ | ◎ | ◎ | ○ | ◎ |
| 41 | 0.23 | 0.19 | 1.21 | ◎ | ◎ | ○ | ○ | ◎ |
| 42 | 0.26 | 0.21 | 1.24 | ◎ | ◎ | ◎ | ○ | ◎ |
| 43 | 0.29 | 0.19 | 1.53 | ○ | ◎ | ◎ | ○ | ◎ |
| 45 | 0.33 | 0.24 | 1.38 | ◎ | ◎ | ○ | ○ | ◎ |

(Evaluation Results)

The bonding wires according to Working Examples 1 through 26 in Table 1 each include the Cu alloy core material and the Pd coating layer formed on the surface of the Cu alloy core material, the thickness of the Pd coating layer being in the preferable range of 0.015 to 0.150 μm and all the FAB shape having been favorable. It has been revealed that the high-temperature reliability of the ball bonded part by the HTS evaluation is favorable when the bonding wire contains at least one element selected from Ni, Zn, Rh, In, Ir, and Pt and the concentration of the elements in total relative to the entire wire is 0.03 to 2% by mass.

In Working Examples 1 through 26, the area reduction rate at the time of wire drawing was 10% or more, and the heat treatment temperature after wire drawing was a low temperature of 500° C. or less, whereby, the crystal orientation <100> angled at 15 degrees or less to the wire longitudinal direction among the crystal orientations in the wire longitudinal direction could be 50% or more when measuring crystal orientations on the cross-section of the core material in the direction perpendicular to the wire axis of the bonding wire, and the average crystal grain size in the cross-section of the core material in the direction perpendicular to the wire axis of the bonding wire could be 0.9 to 1.3 μm. Consequently, the strength ratio (=ultimate strength/0.2% offset yield strength) in all cases was in the range of 1.1 to 1.6 even though the wire contained Ni, Zn, Rh, In, Ir, and Pt. Consequently, the wedge bondability was favorable in all cases.

In contrast, in Comparative Examples 4 through 6 in Table 2, the heat treatment temperature was a high temperature of 600° C. or more, whereby the <100> orientation proportion in the wire longitudinal direction was less than 50%. In Comparative Examples 2 and 7 through 9, the heat treatment temperature was a high temperature of 620° C. or more, whereby the <100> orientation proportion in the wire longitudinal direction was less than 50%, and the average crystal grain size in the cross-section of the core material was more than 1.3 μm. Consequently, in all Comparative Examples 2 and 4 through 9, the strength ratio was more than 1.6, and the wedge bondability was faulty.

In Comparative Examples 1 and 3, when the die area reduction rate was less than 10%, the average crystal grain size in the cross-section of the core material was less than 0.9 μm, the strength ratio was less than 1.1, and the wedge bondability was faulty in both cases.

The invention claimed is:

1. A bonding wire for a semiconductor device, the bonding wire comprising:
   a Cu alloy core material; and
   a Pd coating layer formed on a surface of the Cu alloy core material, wherein
   the bonding wire contains at least one element selected from Ni, Zn, Rh, Ir, and Pt,
   a concentration of the elements in total relative to the entire wire is 0.03% by mass or more and 2% by mass or less, or
   the bonding wire contains In, a concentration of In is 0.07% by mass or more and 2% by mass or less relative to the entire wire,
   when measuring crystal orientations on a cross-section of the core material in a direction perpendicular to a wire axis of the bonding wire, a crystal orientation <100> angled at 15 degrees or less to the wire axis direction has a proportion of 50% or more among crystal orientations in the wire axis direction, and
   an average crystal grain size in the cross-section of the core material in the direction perpendicular to the wire axis of the bonding wire is 0.9 μm or more and 1.3 μm or less.

2. The bonding wire for a semiconductor device according to claim 1, wherein a strength ratio defined by the following Equation (1) is 1.1 or more and 1.6 or less:

$$\text{strength ratio} = \text{ultimate strength}/0.2\% \text{ offset yield strength} \quad (1).$$

3. The bonding wire for a semiconductor device according to claim 1, wherein a thickness of the Pd coating layer is 0.015 μm or more and 0.150 μm or less.

4. The bonding wire for a semiconductor device according to claim 1, further comprising an alloy skin layer containing Au and Pd on the Pd coating layer.

5. The bonding wire for a semiconductor device according to claim 4, wherein a thickness of the alloy skin layer containing Au and Pd is 0.0005 μm or more and 0.050 μm or less.

6. The bonding wire for a semiconductor device according to claim 1, wherein
   the bonding wire contains at least one element selected from Ga, Ge, As, Te, Sn, Sb, Bi, and Se,
   a concentration of the at least one element in total relative to the entire wire is 0.1 ppm by mass or more and 100 ppm by mass or less, and
   Sn≤10 ppm by mass; Sb≤10 ppm by mass; and Bi≤1 ppm by mass.

7. The bonding wire for a semiconductor device according to claim 1, wherein
   the bonding wire further contains at least one element selected from B, P, Mg, Ca, and La, and
   a concentration of each of the at least one element relative to the entire wire is 1 ppm by mass or more and 100 ppm by mass or less.

8. The bonding wire for a semiconductor device according to-claim 1, wherein Cu is present on an outermost surface of the bonding wire.

* * * * *